(12) United States Patent
Lee (10) Patent No.: US 7,658,623 B2
(45) Date of Patent: Feb. 9, 2010

(54) ELECTRONIC APPARATUS WITH A PIN MOUNT

(75) Inventor: Po-Sheng Lee, Sanchung (TW)

(73) Assignee: Hipro Electronics Co., Ltd., Sanchung (TW)

( * ) Notice: Subject to any disclaimer, the term of this patent is extended or adjusted under 35 U.S.C. 154(b) by 0 days.

(21) Appl. No.: 12/254,329

(22) Filed: Oct. 20, 2008

(65) Prior Publication Data

US 2009/0156025 A1  Jun. 18, 2009

(30) Foreign Application Priority Data

Dec. 17, 2007 (TW) .............................. 96221431 U (51) Int. Cl.
*H01R 12/00* (2006.01)
(52) U.S. Cl. ......................................................... 439/78
(58) Field of Classification Search .................. 439/78, 439/380, 607, 677, 680, 541.5, 74
See application file for complete search history.

(56) References Cited

U.S. PATENT DOCUMENTS

| | | | | | |
|---|---|---|---|---|---|
| 5,152,700 | A | * | 10/1992 | Bogursky et al. | ........ 439/733.1 |
| 5,478,248 | A | * | 12/1995 | Mitra et al. | .................... 439/74 |
| 5,725,386 | A | * | 3/1998 | Davis et al. | .................... 439/79 |
| 6,099,351 | A | * | 8/2000 | Wu | ............................ 439/607 |
| 6,155,872 | A | * | 12/2000 | Wu | ......................... 439/541.5 |
| 6,276,971 | B1 | * | 8/2001 | Belopolsky | .................. 439/676 |
| 6,280,256 | B1 | * | 8/2001 | Belopolsky et al. | ......... 439/676 |
| 6,663,425 | B1 | * | 12/2003 | Zhang et al. | ................. 439/607 |
| 6,767,251 | B2 | * | 7/2004 | Yu et al. | ....................... 439/607 |
| 6,908,326 | B2 | * | 6/2005 | Shiota et al. | ................. 439/247 |
| 2005/0032406 | A1 | * | 2/2005 | Shiota et al. | ................. 439/247 |

* cited by examiner

*Primary Examiner*—Chandrika Prasad
(74) *Attorney, Agent, or Firm*—Burr & Brown (57) ABSTRACT

An electronic apparatus has an electronic component and a pin mount. The electronic component has a working surface and two pins protruding from the working surface and each pin being bent to form an L-shape with a proximal part and a distal part. The pin mount has a flat bottom, a rear, two through holes and two communicating recesses. The through holes are defined through the pin mount in parallel, are formed from the front to the rear and receiving the proximal parts of the pins. The communicating recesses are formed in parallel in the front from the through holes toward the bottom of the pin mount, communicate respectively with the through holes and receiving the distal parts of the pins. The pin mount immobilizes the electronic component to prevent the pins from being detached from the electronic component or the PCB to retain the lifetime of the pins.

12 Claims, 7 Drawing Sheets

ELECTRONIC APPARATUS WITH A PIN MOUNT

BACKGROUND OF THE INVENTION

1. Field of Invention

The present invention relates to an electronic apparatus with a pin mount, and more particularly to an electronic apparatus with a pin mount, which allows pins of an electronic component to be bent easily, immobilizes the pins and prevents the pins from being damaged.

2. Description of the Related Art

Figure 7:
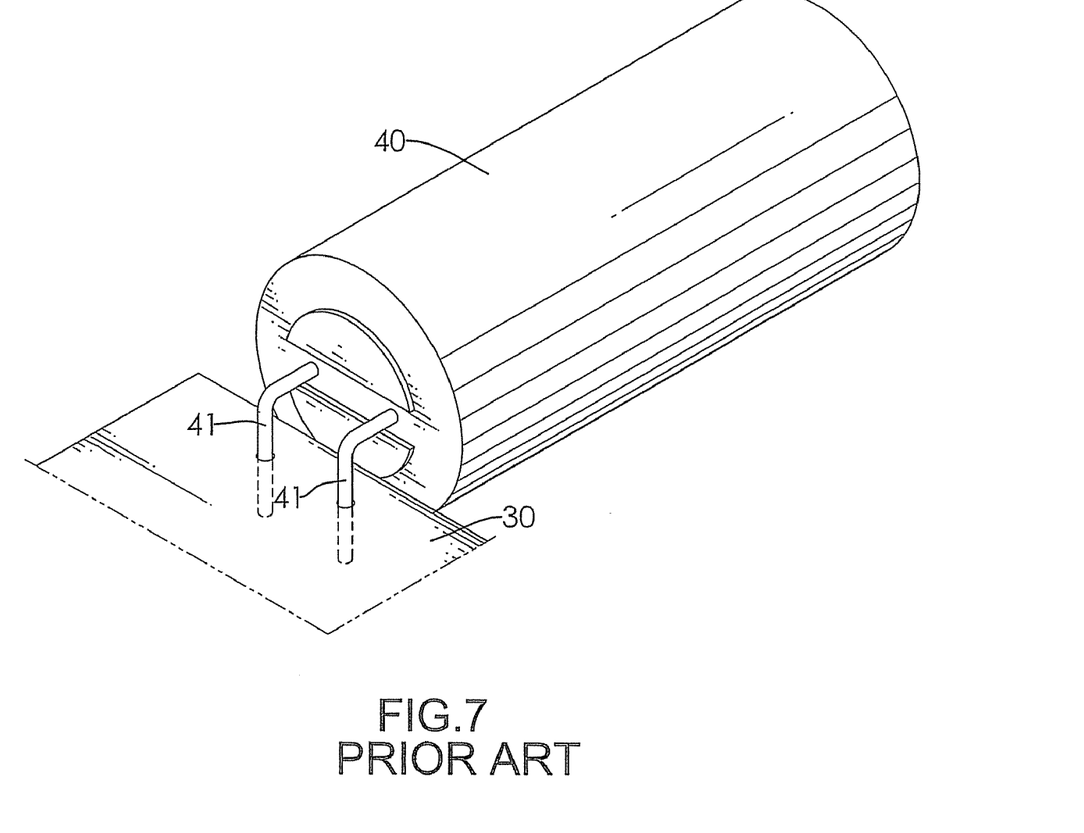
FIG. 7 is an operational perspective view of a conventional electronic apparatus in accordance with the prior art.

With reference to FIG. 7, a conventional electronic apparatus has an electronic component (40) such as capacitor or the like and a print circuit board (PCB, 30). The electronic component (40) has two ends and two pins (41). The pins (41) protrude from one of the ends of the electronic component (40), are bent to form an L-shape and each pin (41) has a proximal end and a distal end. The proximal end connects with the electronic component (40). Furthermore, the PCB (30) electrically connects with the electronic component (40) and has multiple holes. The holes are formed in the PCB (30) and receive the distal ends of the pins of the electronic component (40) and the distal ends are soldered to connect securely with the PCB (30).

However, the electronic component (40) connects with the PCB (30) only by inserting the distal ends of pins (41) into the holes in the PCB (30) and soldering the distal end and the PCB (30). If the electronic apparatus is bumped or is shaken, the electronic component (40) moves easily relative to the PCB (30), which causes solder to be broken or the pins (41) to be bent causing metal fatigue and breakage, both affects electrical connection between the PCB (30) and the electronic component (40).

Additionally, when the pins (41) are bent, a fixture is used to hold the electronic component (40) and then a bending machine is used to bend the pins (41). However, each pin (41) of each electronic component (40) should be bent at the same location to form a uniform shape, which requires difficult machine calibration and monitoring. Furthermore, the distal end of each pin may electrically disconnect from the electronic component (40) or the electronic component (40) may be damaged during bending causing rejects and raising unit costs.

To overcome the shortcomings, the present invention provides an electronic apparatus with a pin mount to mitigate or obviate the aforementioned.

SUMMARY OF THE INVENTION

The primary objective of the present invention is to provide an electronic apparatus with a pin mount, which allows pins of an electronic component to be bent easily, immobilize the pins and prevents the pins from being damaged.

To achieve the objective, an electronic apparatus with a pin mount in accordance with the present invention has an electronic component and a pin mount. The electronic component has a working surface and two pins. The pins protrude from the working surface and each pin is bent to form an L-shape with a proximal part and a distal part and has a distal end and a proximal end. The proximal end connects with the working surface. The pin mount has a flat bottom, a rear, two through holes and two communicating recesses. The rear abuts and corresponds to the working surface of the electronic component. The through holes are defined through the pin mount in parallel, are formed from the front to the rear and allow the pins to extend in the through holes and the proximal part of each pin to be mounted in a corresponding through hole. The communicating recesses are formed in parallel in the front from the through holes toward the bottom of the pin mount, communicate respectively with the through holes and receiving the distal parts of the pins, wherein the distal ends of the pins are lower than the bottom of the pin mount.

The pin mount immobilizes the electronic component to prevent the pins from being detached from the electronic component or the PCB to retain the lifetime of the pins.

Other objectives, advantages and novel features of the invention will become more apparent from the following detailed description when taken in conjunction with the accompanying drawings.

DETAILED DESCRIPTION OF THE INVENTION

Figure 1:
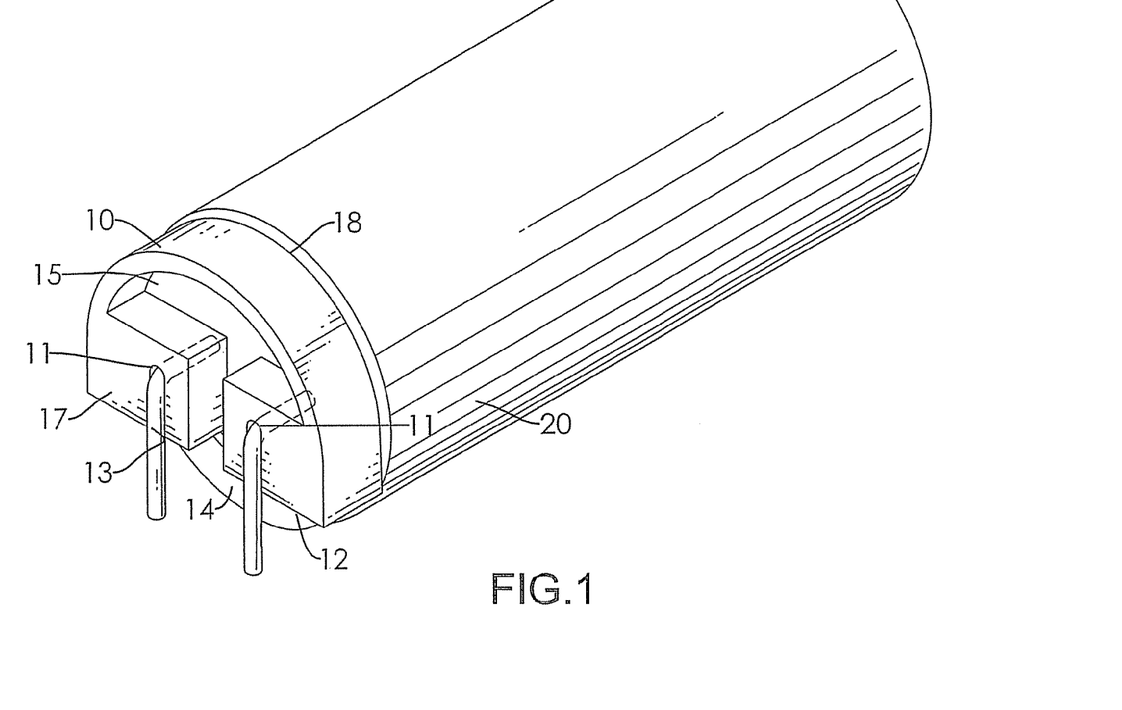
FIG. 1 is a perspective view of a first embodiment of an electronic apparatus with a pin mount in accordance with the present invention.
Figure 2:
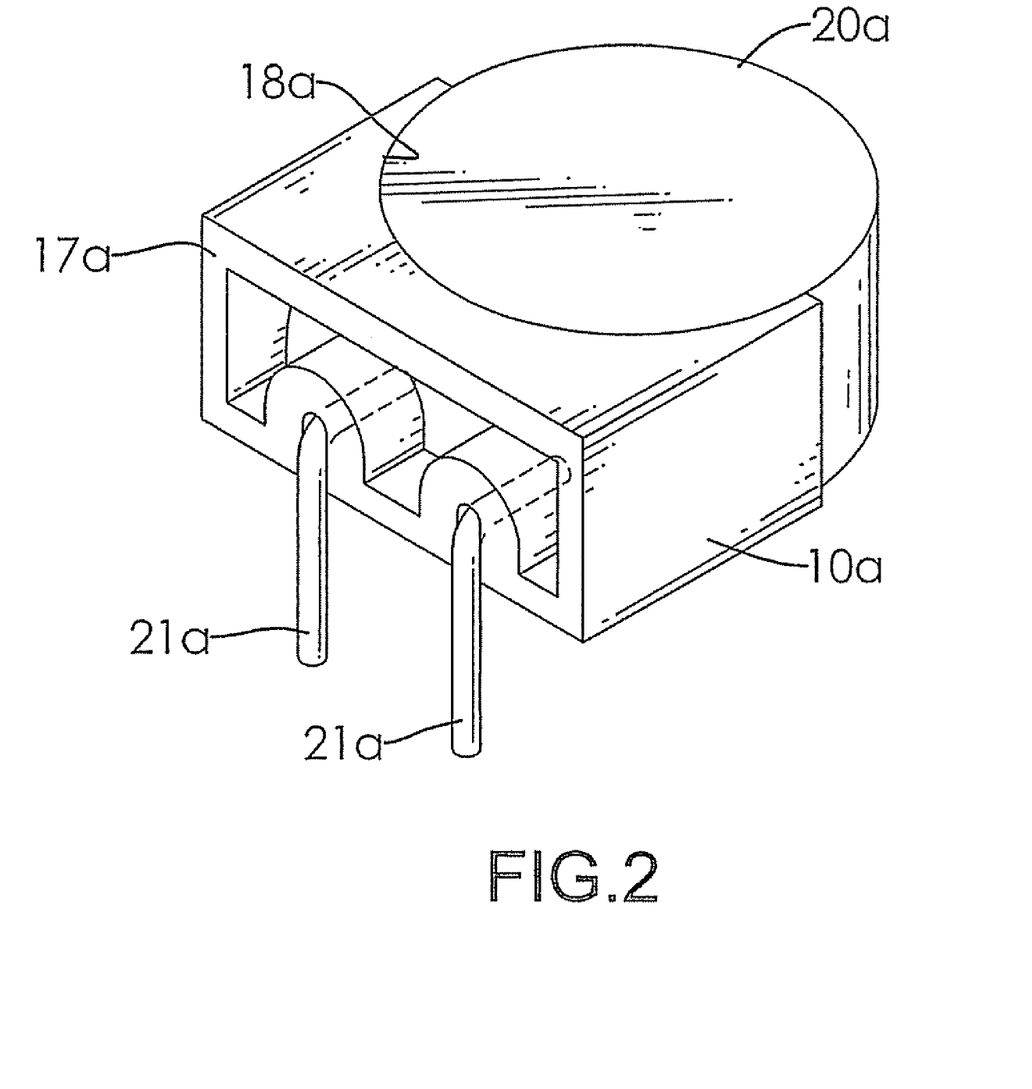
FIG. 2 is a perspective view of a second embodiment of an electronic apparatus with a pin mount in accordance with the present invention.
Figure 3:
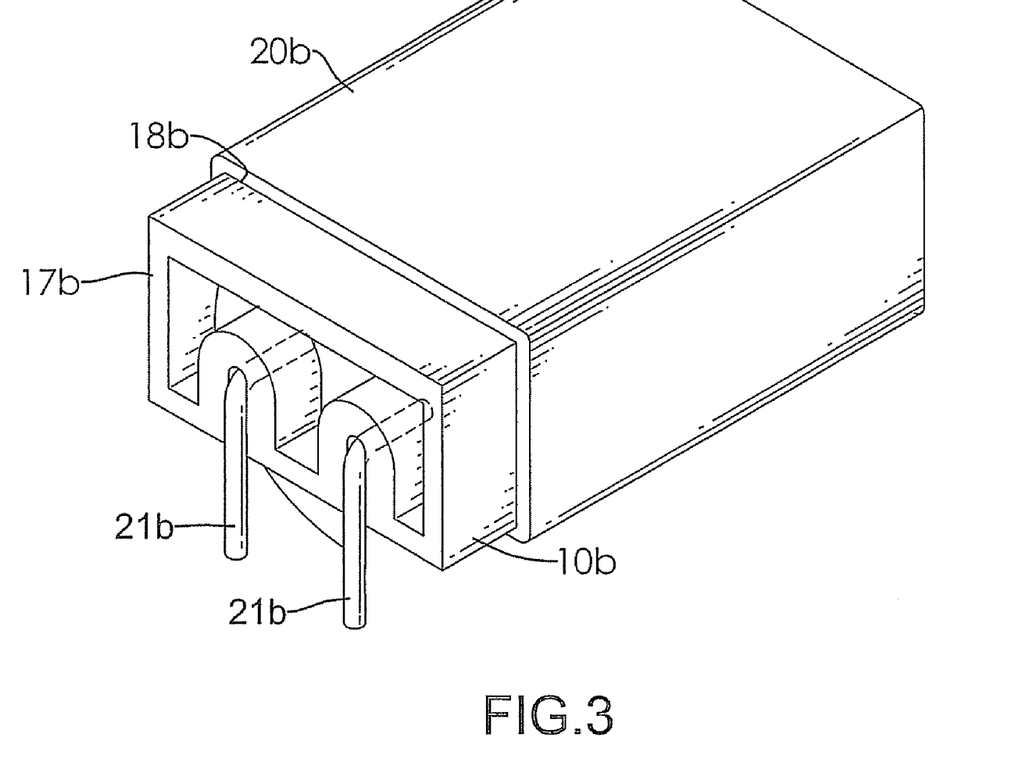
FIG. 3 is a perspective view of a third embodiment of an electronic apparatus with a pin mount in accordance with the present invention.

With reference to FIGS. 1, 2 and 3, an electronic apparatus in accordance with the present invention has an electronic component (20, 20a, 20b) and a pin mount (10, 10a, 10b).

Figure 6:
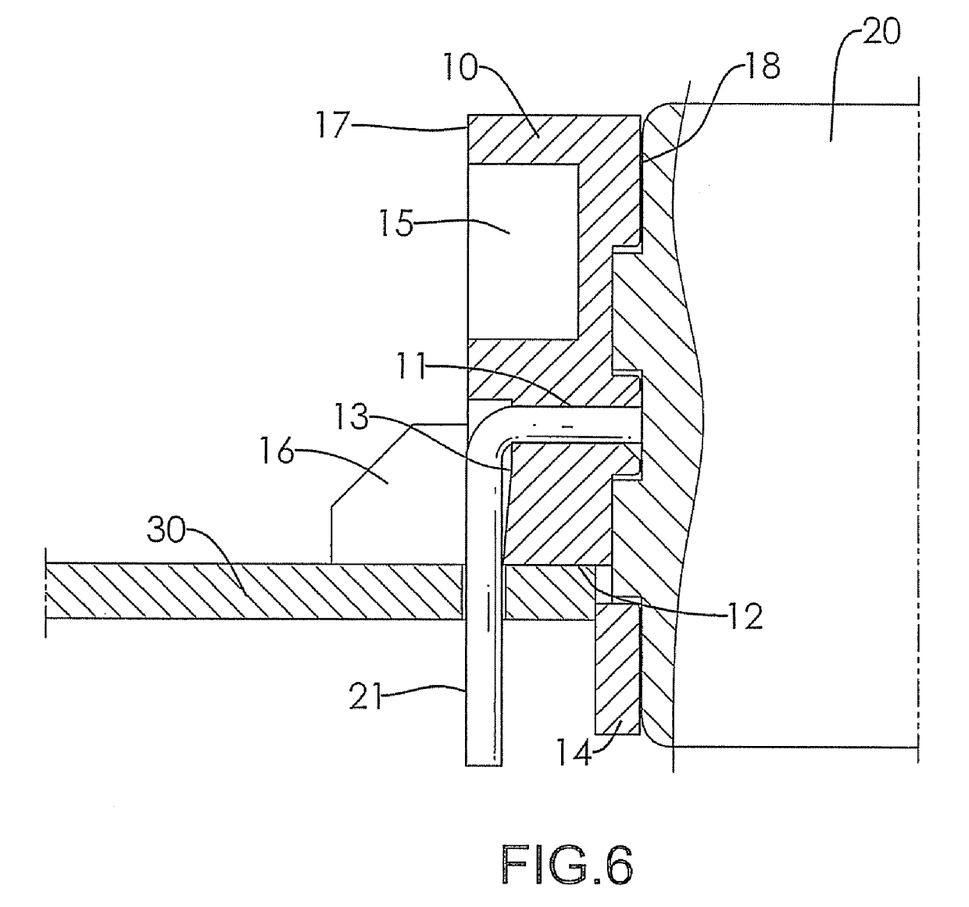
FIG. 6 is a cross sectional side view of the electronic apparatus with the pin mount in FIG. 5.

With further reference to FIG. 6, the electronic component (20, 20a, 20b) may be a cylinder, rectangle, polygon or the like, is mounted on a print circuit board (PCB, 30) with multiple holes and has a working surface (22, 22a, 22b) and two pins (21, 21a, 21b). The working surface (22, 22a, 22b) may be an end of a cylindrical electronic component (20), a cambered surface of a cylindrical electronic component (20a) or a side of a rectangular electronic component (20b). The pins (21, 21a, 21b) protrude from the working surface (22, 22a, 22b) and each pin (21, 21a, 21b) is bent to form an L-shape with a proximal part and a distal part and has a proximal end and a distal end. The proximal end of the pin (21, 21a, 21b) connects with the working surface (22, 22a, 22b). The distal end is inserted in the hole in the PCB (30) and is soldered to connect electrically with the PCB (30).

Figure 4:
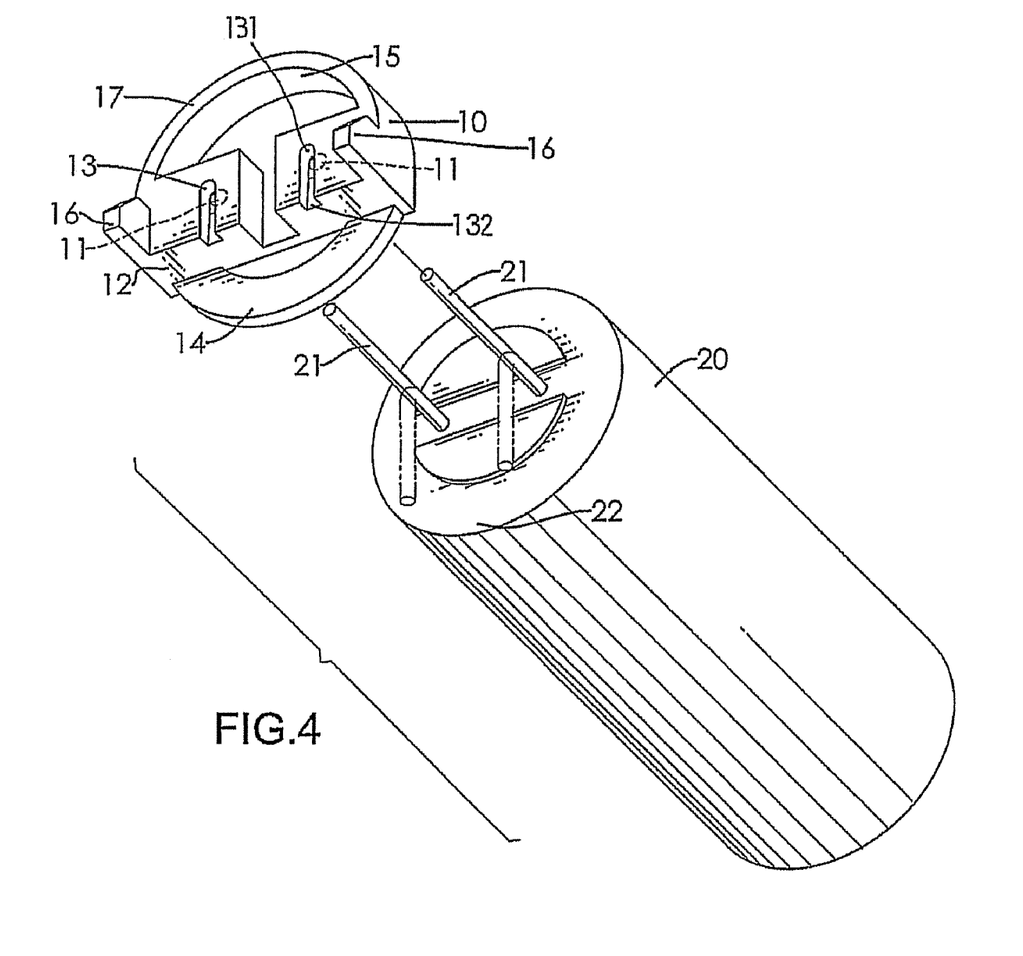
FIG. 4 is an exploded perspective view of a fourth embodiment of an electronic apparatus with a pin mount in accordance with the present invention.
Figure 5:
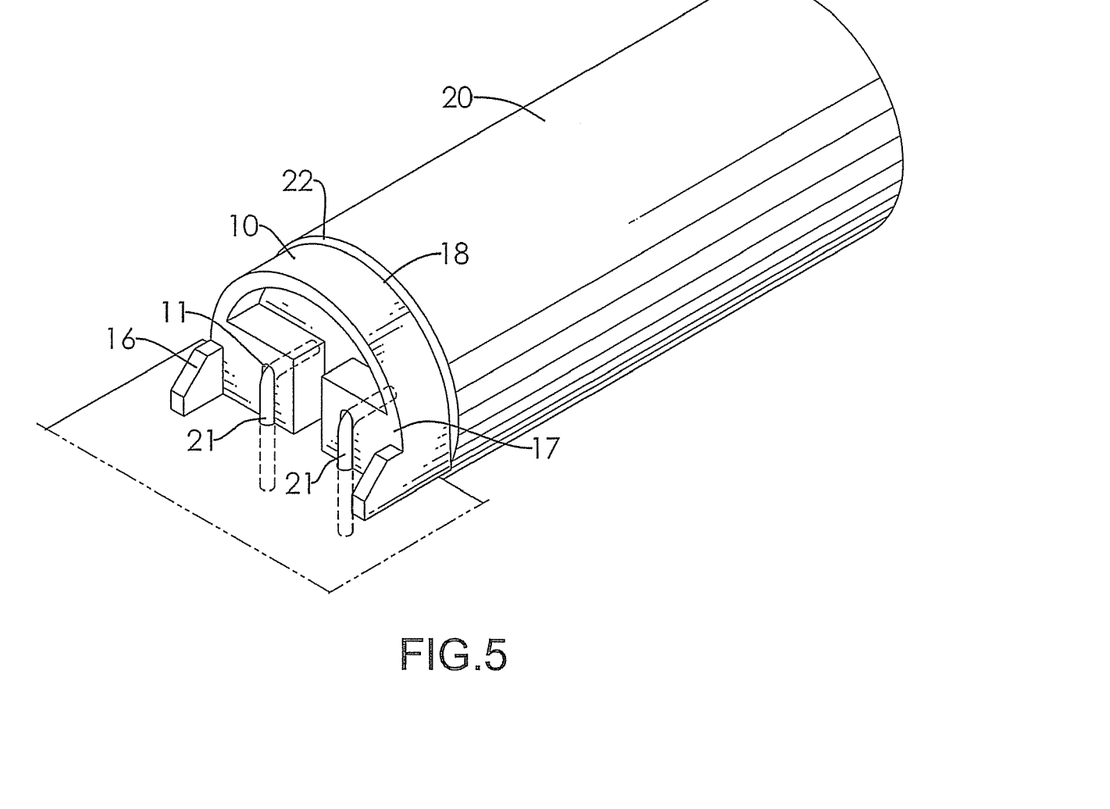
FIG. 5 is an operational perspective view of the electronic apparatus with the pin mount in FIG. 4 on a print circuit board (PCB)

With further reference to FIGS. 4 and 5, the pin mount (10, 10a, 10b) has a bottom (12), a front (17, 17a, 17b), a rear (18, 18a, 18b), two through holes (11), two communicating recesses (13), an optional reinforcing board (14), two optional protrusions (16) and at least one optional concave (15).

The bottom (12) is flat.

The rear (18, 18a, 18b) abuts and corresponds to the working surface (22, 22a, 22b) of the electronic component (20, 20a, 20b) and may be flat, concave, convex, cambered or the like.

The through holes (11) are defined through the pin mount (10, 10a, 10b) in parallel, are formed from the front (17, 17a, 17b) to the rear (18, 18a, 18b), correspond respectively to the pins (21, 21a, 21b) and allow the pins (21, 21a, 21b) to extend in the through holes (11) and the proximal part of each pin (21, 21a, 21b) to be mounted in a corresponding through hole (11).

The communicating recesses (13) are formed in parallel in the front (17, 17a, 17b) from the through holes (11) toward the bottom (12) of the pin mount (10, 10a, 10b), communicate respectively with the through holes (11) and receive the distal parts of the pins (21, 21a, 21b), wherein the distal ends of the pins (21, 21a, 21b) are lower than the bottom (12) of the pin mount (10, 10a, 10b) to allow the insertion of the pins (21, 21a, 21b) into the holes of the PCB (30). Each communicating recess (13) has a closed top end (131) and an open bottom end (132). The open bottom end (132) allows the pin (21, 21a, 21b) to extend out of the communicating recess (13).

The reinforcing board (14) protrude downward from the bottom (12), is flush with the rear (18, 18a, 18b) and abuts and corresponds to the working surface (22, 22a, 22b) of the electronic component (20, 20a, 20b).

The protrusions (16) protrude from the front (17, 17a, 17b) near two sides of the front (17, 17a, 17b) and each protrusion (16) has a bottom surface. The bottom surface is flat and is flush with the bottom (12) of the pin mount (10, 10a, 10b).

The concave (15) is formed in the front (17, 17a, 17b) to strengthen the pin mount (10, 10a, 10b) and lower material cost.

When the pin mount (10, 10a, 10b) is used, the pins (21, 21a, 21b) of the electronic component (20, 20a, 20b) extend into the through holes (11), so the proximal parts of the pins (21, 21a, 21b) are mounted in the through holes (11). Then the pins (21, 21a, 21b) are bent to allow the distal part of each pin (21, 21a, 21b) to be mounted in a corresponding communicating recess (13). The distal ends of the pins (21, 21a, 21b) are lower than the bottom (12) of the pin mount (10, 10a, 10b) and are inserted into holes in the PCB (30). The pin mount (10, 10a, 10b) is placed on the PCB (30). Because the bottom (12) of the pin mount (10, 10a, 10b) and the bottom surface of the protrusions (16) are flat, the pin mount (10, 10a, 10b) is mounted steadily on the PCB (30).

The pin mount (10, 10a, 10b) of the present invention has following advantages:

(a) Each pin (21, 21a, 21b) of the electronic component (20, 20a, 20b) can be bent along the through hole (11) and the communicating recess (13) by hand without any fixtures or other assistant tools to obtain a uniform shape.

(b) The proximal parts of the pins (21, 21a, 21b) are mounted in the through holes (11) before the pins (21, 21a, 21b) are bent, therefore, the pins (21, 21a, 21b) connect securely with the working surface (22, 22a, 22b) of the electronic component (20, 20a, 20b) when the pins (21, 21a, 21b) are bent.

(c) When the electronic apparatus is bumped or is shaken, the electronic component (20, 20a, 20b) will not move easily relative to the PCB (30) because the bottom (12) of the pin mount (10, 10a, 10b) is mounted on the PCB (30). Accordingly, solder will not be broken and the electronic component (40) and the electronic apparatus retain their lifetime.

Even though numerous characteristics and advantages of the present invention have been set forth in the foregoing description, together with details of the structure and function of the invention, the disclosure is illustrative only. Changes may be made in detail, especially in matters of shape, size and arrangement of parts within the principles of the invention to the full extent indicated by the broad general meaning of the terms in which the appended claims are expressed.

What is claimed is:

1. An electronic apparatus, comprising:
an electronic component having
a working surface; and
two pins protruding from the working surface and each pin having a proximal part and a distal part respectively having a distal end and a proximal end connecting with the working surface and the proximal part and the distal part have the same dimension;
a pin mount having
a bottom being flat;
a front;
a rear abutting and corresponding to the working surface of the electronic component;
two through holes being defined through the pin mount in parallel, corresponding respectively to the pins, being formed from the front to the rear and allowing the pins to extend in the through holes and the proximal parts of the pins to be respectively mounted in the through holes;
two communicating recesses being formed in parallel in the front from the through holes toward the bottom of the pin mount, communicating respectively with the through holes and receiving the distal parts of the pins and each communicating recess having a closed top end and an open bottom end allowing the pin to extend out of the communicating recess, wherein the pins are extended through the through holes allowing the proximal parts of the pins to be respectively mounted in the through holes, then are bent along the pin mount to allow each pin to be bent to form an L-shape and the distal part of each pin to be partially mounted in the communicating recess and exposed outside the pin mount such that the distal ends of the pins are lower than the bottom of the pin mount.

2. The electronic apparatus as claimed in claim 1, wherein the pin mount further has a reinforcing board protruding downward from the bottom, being flush with the rear and abutting and corresponding to the working surface of the electronic component.

3. The electronic apparatus as claimed in claim 1, wherein the pin mount further has two protrusions protruding from the front near two sides of the front and each protrusion having a bottom surface that is flat and is flush with the bottom of the pin mount.

4. The electronic apparatus as claimed in claim 2, wherein the pin mount further has two protrusions protruding from the front near two sides of the front and each protrusion having a bottom surface that is flat and is flush with the bottom of the pin mount.

5. The electronic apparatus as claimed in claim 1, wherein the pin mount further has at least one concave being formed in the front.

6. The electronic apparatus as claimed in claim 2, wherein the pin mount further has at least one concave being formed in the front.

7. The electronic apparatus as claimed in claim 3, wherein the pin mount further has at least one concave being formed in the front.

8. The electronic apparatus as claimed in claim 4, wherein the pin mount further has at least one concave being formed in the front.

9. The electronic apparatus as claimed in claim 1, wherein
   the electronic component is a cylindrical electronic component and the working surface is an end of the cylindrical electronic component;
   the rear of the pin mount is flat to correspond to the end of the cylindrical electronic component.

10. The electronic apparatus as claimed in claim 1, wherein
    the electronic component is a cylindrical electronic component and the working surface is a cambered surface of the cylindrical electronic component;
    the rear of the pin mount is concave to correspond to the cambered surface of the cylindrical electronic component.

11. The electronic apparatus as claimed in claim 1, wherein
    the electronic component is a rectangular electronic component and the working surface a side of the rectangular electronic component;
    the rear of the pin mount is flat to correspond to the end of the cylindrical electronic component.

12. The electronic apparatus as claimed in claim 1, wherein the electronic component is a capacitor.

* * * * *